United States Patent
Kautzsch et al.

(10) Patent No.: US 12,137,500 B2
(45) Date of Patent: Nov. 5, 2024

(54) LIGHT EMITTER DEVICES, OPTICAL FILTER STRUCTURES AND METHODS FOR FORMING LIGHT EMITTER DEVICES AND OPTICAL FILTER STRUCTURES

(71) Applicant: Infineon Technologies AG, Neubiberg (DE)

(72) Inventors: Thoralf Kautzsch, Dresden (DE); Heiko Froehlich, Radebeul (DE); Uwe Rudolph, Dresden (DE); Alessia Scire, Dresden (DE); Maik Stegemann, Pesterwitz (DE); Mirko Vogt, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 1148 days.

(21) Appl. No.: 16/857,400

(22) Filed: Apr. 24, 2020

(65) Prior Publication Data

US 2020/0253000 A1    Aug. 6, 2020

Related U.S. Application Data

(60) Division of application No. 15/461,810, filed on Mar. 17, 2017, now Pat. No. 10,681,777, which is a
(Continued)

(30) Foreign Application Priority Data

Feb. 3, 2017   (DE) .......................... 102017102183.3

(51) Int. Cl.
*H05B 3/00* (2006.01)
*G01F 1/68* (2006.01)
(Continued)

(52) U.S. Cl.
CPC ........... *H05B 3/0014* (2013.01); *G01N 29/02* (2013.01); *G01N 29/2418* (2013.01);
(Continued)

(58) Field of Classification Search
CPC ........ C12M 1/00; C12M 3/006; C12M 35/02; C12M 35/04; C12N 15/89; G03F 7/038;
(Continued)

(56) References Cited

U.S. PATENT DOCUMENTS 6,376,787 B1    4/2002   Martin et al.
6,452,124 B1    9/2002   York et al.
(Continued)

FOREIGN PATENT DOCUMENTS

CN    101919079 A    12/2010
CN    102197293 A    9/2011
(Continued)

OTHER PUBLICATIONS

De Souza, Michelly, et al. "Thin-film lateral SOI PIN diodes for thermal sensing reaching the cryogenic regime", Journal Integrated Circuits and Systems 5.2 (2010): 8 pages.
(Continued)

*Primary Examiner* — Nathaniel E Wiehe
*Assistant Examiner* — Ket D Dang
(74) *Attorney, Agent, or Firm* — Slater Matsil, LLP

(57) ABSTRACT

A light emitter device contains a heater structure configured to emit light if a predefined current flows through the heater structure. The heater structure is arranged at a heater carrier structure. The light emitter device contains an upper portion of a cavity located vertically between the heater carrier structure and a cover structure. The light emitter device contains a lower portion of the cavity located vertically between the heater carrier structure and at least a portion of a carrier substrate. The heater carrier structure contains a
(Continued)

plurality of holes connecting the upper portion of the cavity and the lower portion of the cavity. A pressure within the cavity is less than 100 mbar.

20 Claims, 10 Drawing Sheets

Related U.S. Application Data continuation-in-part of application No. 15/089,027, filed on Apr. 1, 2016, now Pat. No. 10,347,814.

(51) Int. Cl.
| | |
|---|---|
| G01N 29/02 | (2006.01) |
| G01N 29/24 | (2006.01) |
| H01L 33/44 | (2010.01) |
| H01L 33/52 | (2010.01) |
| H01L 33/60 | (2010.01) |
| H01L 33/64 | (2010.01) |

(52) U.S. Cl.
CPC .............. *H01L 33/52* (2013.01); *H01L 33/60* (2013.01); *H01L 33/642* (2013.01); *G01F 1/68* (2013.01); *G01N 2291/021* (2013.01); *G01N 2291/02809* (2013.01); *H01L 33/44* (2013.01); *H05B 2203/017* (2013.01)

(58) Field of Classification Search
CPC . G03F 7/16; G03F 7/162; G03F 7/168; G03F 7/2002; G03F 7/26; G03F 7/322; G01F 1/68; G01N 2291/021; G01N 2291/02809; G01N 29/02; G01N 29/2418; H01L 33/44; H01L 33/52; H01L 33/60; H01L 33/642; H05B 2203/017; H05B 3/0014
USPC ......................................................... 219/553
See application file for complete search history.

(56) References Cited

U.S. PATENT DOCUMENTS

| | | | |
|---|---|---|---|
| 6,633,693 B1 | 10/2003 | Peale et al. | |
| 6,750,596 B2 | 6/2004 | Kim et al. | |
| 6,777,765 B2 | 8/2004 | Chen et al. | |
| 8,823,157 B2* | 9/2014 | Chang | H01L 25/0756 |
| | | | 257/89 |
| 9,354,369 B2* | 5/2016 | Hendrix | H04N 5/33 |
| 9,417,186 B2 | 8/2016 | Jakoby et al. | |
| 9,765,934 B2* | 9/2017 | Rogers | H01L 24/24 |
| 10,347,814 B2 | 7/2019 | Glacer | |
| 10,468,383 B2* | 11/2019 | Shizukuishi | H01L 25/0657 |
| 2003/0080839 A1 | 5/2003 | Wong | |
| 2004/0065894 A1 | 4/2004 | Hashimoto et al. | |
| 2004/0119126 A1 | 6/2004 | Chen et al. | |
| 2007/0194712 A1 | 8/2007 | Shiraishi et al. | |
| 2008/0124565 A1 | 5/2008 | Carlson et al. | |
| 2009/0040008 A1 | 2/2009 | Aksyuk et al. | |
| 2009/0155580 A1 | 6/2009 | Shibata et al. | |
| 2010/0126834 A1 | 5/2010 | Ikehashi | |
| 2010/0276726 A1 | 11/2010 | Cho et al. | |
| 2010/0277040 A1 | 11/2010 | Klee et al. | |
| 2011/0211354 A1 | 9/2011 | Kim | |
| 2012/0012864 A1 | 1/2012 | Xie et al. | |
| 2012/0118060 A1 | 5/2012 | Kimura | |
| 2012/0297860 A1 | 11/2012 | Izawa et al. | |
| 2013/0313675 A1 | 11/2013 | Nakano et al. | |
| 2014/0003458 A1* | 1/2014 | Han | H01L 21/306 |
| | | | 372/45.01 |
| 2015/0101395 A1 | 4/2015 | Dehe et al. | |
| 2015/0102372 A1 | 4/2015 | Dehe et al. | |
| 2015/0179861 A1 | 6/2015 | Maes et al. | |
| 2019/0237654 A1 | 8/2019 | Glacer | |

FOREIGN PATENT DOCUMENTS

| | | |
|---|---|---|
| CN | 103380353 A | 10/2013 |
| CN | 104817054 A | 8/2015 |
| DE | 102004030380 A1 | 1/2006 |
| DE | 102006059091 A1 | 7/2007 |
| DE | 102013206755 A1 | 10/2013 |
| EP | 1640771 A1 | 3/2006 |
| EP | 3096345 A1 | 11/2016 |
| FR | 2766962 A1 | 2/1999 |
| GB | 2501681 A | 11/2013 |
| JP | 2007086038 A | 4/2007 |
| KR | 20140032825 | 3/2014 |
| TW | I1724787 B * | 9/2015 |
| WO | 2006031125 A1 | 3/2006 |
| WO | 2013159075 A1 | 10/2013 |

OTHER PUBLICATIONS

Hodgkinson, et al., "Non-dispersive infra-red (NDIR) measurement of carbon dioxide at 4.24.2μm in a compact and optically efficient sensor", Sensors and Actuators B: Chemical, vol. 186, Sep. 2013, 21 Pages.
Liu, et al., "A Micromachined Flow Shear Stress Sensor based on Thermal Transfer Principles", Journal of Microelectromechanical Systems, vol. 8, Issue: 1, Mar. 1999, 24 pages.
Ma, et al., "Methane Detection with High Temperature All-silicon Microheater", Sensors, 2014 IEEE, Dec. 2014—ieeexplore.ieee.org, 4 pages.
Mastrangelo, et al., "V acuum-Sealed Silicon Micromachined Incandescent Light Source", Electron Devices Meeting, 1989, IEDM '89. Technical Digest., International—ieeexplore.ieee.org, 4 pages.
Sauer, M., U. Schiller, and M. Arndt. "A Climate Control Sensor for optimizing the circulating-air mode by controlling the CO2 level inside the passenger compartment." 1st European Mobile Air Conditioning Workshop. 2005, 7 pages.
Schell, et al., "Demand Control Ventilation Using CO2", ASHRAE Journal, New York 43.2, ashraejournal.org, Feb. 2001, 6 pages.
Zosel, et al., "The measurement of dissolved and gaseous carbon dioxide concentration", Topical Review, IOP Publishing, LTD, Measurement Science and Technology, vol. 22, No. 7, May 2011, 47 pages.

* cited by examiner

LIGHT EMITTER DEVICES, OPTICAL FILTER STRUCTURES AND METHODS FOR FORMING LIGHT EMITTER DEVICES AND OPTICAL FILTER STRUCTURES

This application is a divisional of U.S. patent application Ser. No. 15/461,810, filed Mar. 17, 2017, which application claims the benefit of German Patent Application No. 10 2017 102 183.3, filed on Feb. 3, 2017, and is also a continuation-in-part of U.S. patent application Ser. No. 15/089,027, filed on Apr. 1, 2016, entitled, "MEMS Heater or Emitter Structure for Fast Heating and Cooling Cycles," which applications are incorporated herein by reference in their entireties.

TECHNICAL FIELD

Examples relate to concepts for generating light and applications thereof and in particular to light emitter devices, optical filter structures, methods for forming light emitter devices and methods for forming optical filter structures.

BACKGROUND

Light emitter devices, e.g. light emitter devices for gas sensing applications, may have to be optimized with respect to various goals, such as cost, fabrication complexity or power consumption

SUMMARY

There may be a demand to provide an improved concept for light emitter devices and/or optical filters, which may enable light emitter devices and/or optical filters with a lower power consumption and/or at lower costs.

Such a demand may be satisfied by the subject matter of the claims.

An example relates to a light emitter device. The light emitter device comprises a heater structure configured to emit light if a predefined current flows through the heater structure. The heater structure is arranged at a heater carrier structure. The light emitter device comprises an upper portion of a cavity located vertically between the heater carrier structure and a cover structure. The light emitter device comprises a lower portion of the cavity located vertically between the heater carrier structure and at least a portion of a carrier substrate. The heater carrier structure comprises a plurality of holes connecting the upper portion of the cavity and the lower portion of the cavity. A pressure within the cavity is less than 100 mbar.

An example relates to a method for forming a light emitter device. The method comprises forming a structured sacrificial layer above a heater carrier structure. A heater structure is arranged at the heater carrier structure. The method comprises forming an insulation layer on the structured sacrificial layer. The method comprises removing a portion of the insulation layer until the structured sacrificial layer is uncovered to obtain a smooth surface. The method comprises forming a cover structure on the smooth surface. The method comprises forming at least one hole through the cover structure to the structured sacrificial layer. The method comprises removing the structured sacrificial layer to obtain a cavity between the heater carrier structure and the cover structure. The method comprises sealing the at least one hole at an ambient pressure of less than 100 mbar.

An example relates to an optical filter structure. The optical filter structure comprises a plurality of semiconductor layers of a filter layer stack. The optical filter structure comprises a plurality of cavity layers of the filter layer stack arranged alternatingly to the semiconductor layers of the plurality of semiconductor layers. A thickness of the semiconductor layers of the plurality of semiconductor layers is less than 2 µm and a thickness of the cavity layers of the plurality of cavity layers is less than 4 µm so that light passing the filter layer stack comprises a spectral maximum at a desired optical wavelength.

An example relates to a method for forming an optical filter structure. The method comprises forming a plurality of semiconductor layers and a plurality of sacrificial layers of an intermediate layer stack. The plurality of sacrificial layers is arranged alternatingly to the semiconductor layers of the plurality of semiconductor layers. The method comprises forming at least one hole through the intermediate layer stack to at least a lowest sacrificial layer of the plurality of sacrificial layers. The method comprises removing the plurality of sacrificial layers to obtain a filter layer stack comprising the plurality of semiconductor layers and a plurality of cavity layers arranged alternatingly to the semiconductor layers of the plurality of semiconductor layers. A thickness of semiconductor layers of the plurality of semiconductor layers is less than 2 µm and a thickness of cavity layers of the plurality of cavity layers is less than 4 µm so that light passing the filter layer stack comprises a spectral maximum at a desired optical wavelength.

BRIEF DESCRIPTION OF THE DRAWINGS

Some examples of apparatuses and/or methods will be described in the following by way of example only, and with reference to the accompanying figures, in which:

FIGS. 8A and 9B show schematic cross sections of an optical filter structure;

DETAILED DESCRIPTION OF ILLUSTRATIVE EMBODIMENTS

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
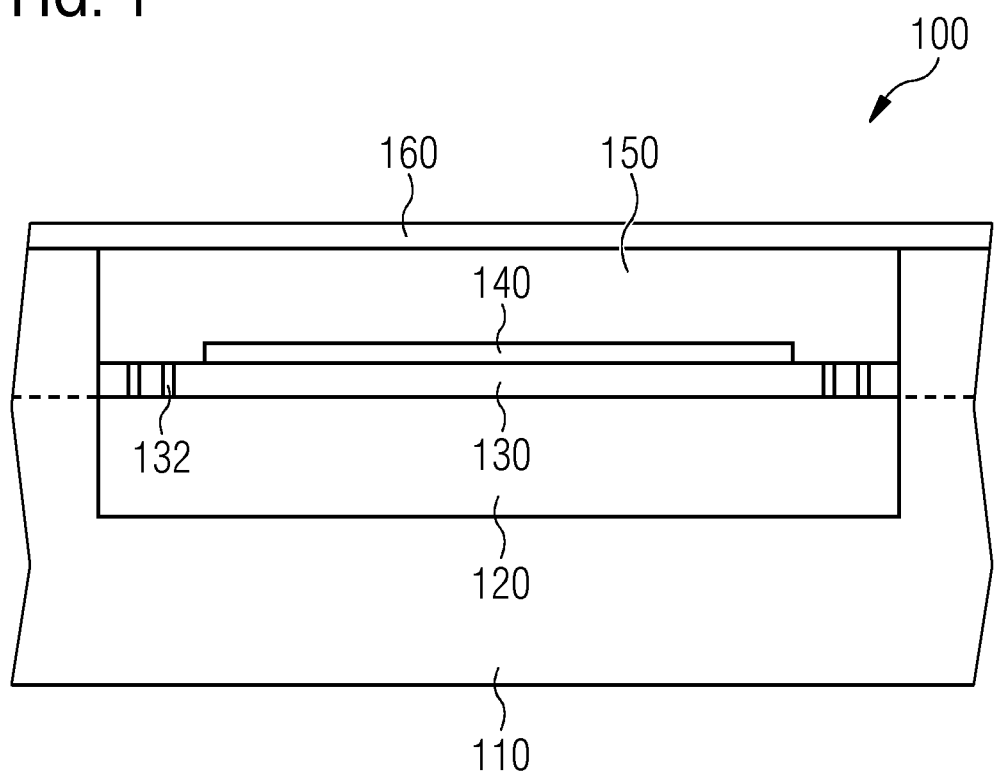
FIG. 1 shows a schematic cross section of a light emitter device.

FIG. 1 shows a schematic cross section of a light emitter device 100. The light emitter device comprises a heater structure (e.g. a light emitting structure) 140 configured to emit light if a predefined current flows through the heater structure 140. The heater structure is arranged at (e.g. at a front side or a back side of) a heater carrier structure 130. The light emitter device comprises an upper portion 150 of a cavity located vertically between the heater carrier structure 130 and a cover structure 160. The light emitter device comprises a lower portion 120 of the cavity located vertically between the heater carrier structure 130 and at least a portion of a carrier substrate 110. The heater carrier structure 130 comprises a plurality of holes 132 connecting the upper portion 150 of the cavity and the lower portion 120 of the cavity. A pressure (e.g. air pressure or ambient pressure) within the cavity is less than 100 mbar (or less than 10 mbar, less than 1 mbar, less than 0.1 mbar, less than 0.01 mbar).

Due to the heater carrier structure being located within the cavity (at a low pressure, e.g. near-vacuum) and due to the plurality of holes within the heater carrier structure, a conduction of heat to walls of the cavity (e.g. via the heater carrier structure or through air/gas within the cavity) may be reduced. In this way, a loss of power of the light emitter device 100 due to heat conduction may be reduced and a power consumption of the light emitter device 100 may be reduced, permitting more compact dimensions of the light emitter device and/or an improved emission efficiency.

For example, the heater carrier structure 130 may correspond to a membrane structure. For example, the heater carrier structure may span between (side) walls of the cavity. For example, the heater carrier structure 130 might be detached/separated from lateral surfaces of the cavity e.g. from a bottom surface (e.g. formed by the carrier substrate 110) and to a ceiling surface (e.g. formed by the cover structure 160) of the cavity. For example, the carrier structure might (only) be attached to side/vertical walls of the cavity. For example, the heater carrier structure 130 may extend in a first lateral direction and in a second lateral direction. The second lateral direction may be (oriented) orthogonal to the first lateral direction. The heater carrier structure 130 may be connected (may connect) to walls of the cavity at both sides in the first lateral direction and at both sides in the second lateral direction. This may improve a stability of the heater carrier structure. For example, the heater carrier structure 130 may comprise a vertical thickness of less than 20 µm (or less than 15 µm, less than 10 µm). For example, the heater carrier structure 130 may be or comprise a structured oxide layer. For example, the heater carrier structure 130 may comprise a lateral length and a lateral width each at least 5 m (or at least 10 µm, at least 50 µm, at least 100 µm) larger than a lateral length and lateral width of the cavity. For example, the heater carrier structure 130 may laterally overlap the cavity on all lateral sides.

For example, the plurality of holes 132 may vertically extend through the heater carrier structure 130. For example, the plurality of holes 132 may correspond to a plurality of trenches extending through the heater carrier structure 130. For example, the plurality of holes 132 may permit a flow of air or gas between the lower portion 120 and the upper portion 150 of the cavity. For example, through the plurality of holes 132, a substantially equal pressure is achieved within the lower portion 120 and the upper portion 150 of the cavity. For example, a lateral width/diameter of holes of the plurality of holes 132 may be larger than 500 nm (or larger than 1 µm, larger than 2 µm, larger than 5 µm). For example, a lateral width/diameter of holes of the plurality of holes 132 may be smaller than 10 µm (or smaller than 8 µm, smaller than 5 µm, smaller than 2 µm).

For example, (holes of) the plurality of holes 132 may comprise an elongated lateral shape. For example, the elongated lateral shape may comprise a lateral length at least 4 times (or at least 5 times, at least 8 times, at least 10 times) as large as a lateral width of the elongated lateral shape. The elongated lateral shape may obscure/lengthen a path of heat towards edges of the heater carrier structure. The elongated lateral shape of a hole of the plurality of holes may be oriented in parallel to an edge of the heater carrier structure (e.g. an edge of the heater carrier structure 130 attached to a wall of the cavity).

Figure 2:
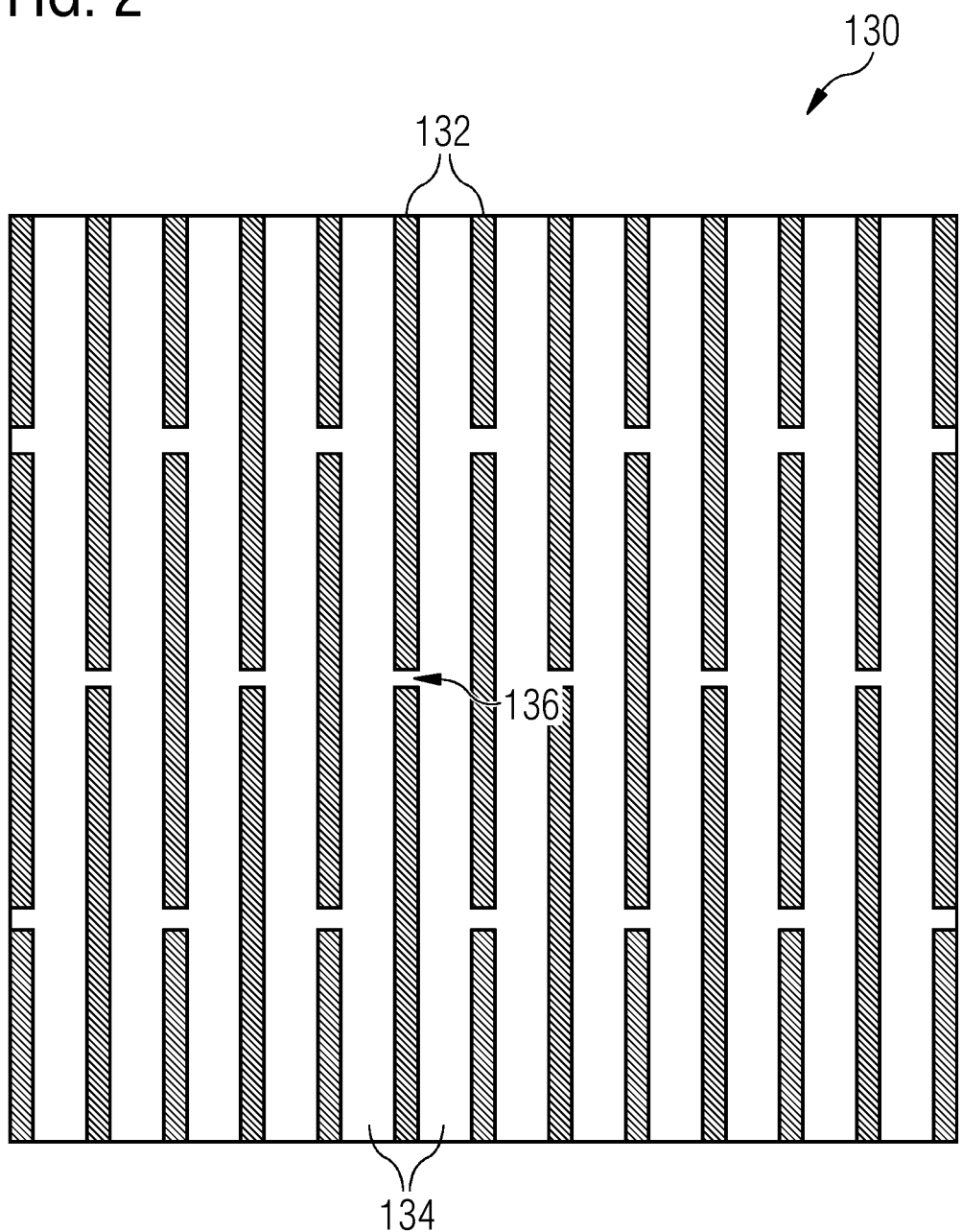
FIG. 2 shows a schematic top view of a heater carrier structure located within a cavity.

For example, the plurality of holes 132 may be arranged in a plurality of rows of holes. For example, the holes of a row of the plurality of rows of holes may comprise an elongated lateral shape oriented in parallel to the row. For example, rows of the plurality of rows of holes may be oriented in parallel to an edge of the heater carrier structure. The plurality of rows of holes may be separated by a plurality of stripes of the carrier structure laterally arranged in parallel to the plurality of rows of holes (e.g. as shown in FIG. 2). A width of the holes of a row of the plurality of rows of holes located between two neighboring stripes of the plurality of stripes may be less than 60% (or less than 50%, less than 40%, less than 30%, less than 20%, less than 10%, less than 5%) of a width of each of the two neighboring stripes. For example, the plurality of rows of holes and plurality of stripes may be arranged alternatingly. For example, two neighboring stripes of the plurality of stripes may be laterally connected by lateral connecting bars of solid material separating holes of a row of the plurality of rows of holes located between the two neighboring stripes.

The plurality of holes arranged in a plurality of rows of holes may obstruct a path of the heat towards an edge of the heater carrier structure. For example, holes of neighboring rows of the plurality of rows of holes may comprise a lateral offset of more than 20% (or more than 30%, more than 40%, more than 50%) of a length of a hole of the neighboring rows. For example, the lateral offset of holes of a row of the plurality of rows of holes may be measured in parallel to an orientation of the row (e.g. in parallel to a lateral direction of a maximal expansion of the row). The lateral offset may further obstruct/lengthen a path of the heat towards an edge of the heater carrier structure (e.g. as further shown in FIG. 2).

For example, the plurality of holes 132 may be arranged and formed so that, from a center of the heater carrier structure 130 to a closest edge of the carrier structure, a path along the heater carrier structure is at least 20% (or at least 30%, at least 40%, at least 50%, at least 80%, at least 100%, at least 200%, at least 400%) longer than a direct straight path from the center of the heater carrier structure to the closest edge of the carrier structure. For example, the center of the heater carrier structure may correspond to a lateral geometric center of the heater carrier structure, or to a lateral point of the heater carrier structure located at a lateral geometric center of the heater structure. For example, the center of the heater carrier structure may correspond to a lateral point of the heater carrier structure 130 where a heat absorbed from the heater structure 140 is most pronounced. A longer path may reduce a conduction of heat towards an edge of the heater carrier structure. For example, the plurality of holes may form a repetitive pattern to reduce a thermal conductivity of the carrier structure compared to a solid-structured carrier structure.

For example, the lower portion 120 and the upper portion 150 may be separated by the heater carrier structure 130. For example, the lower portion 120 of the cavity may form a cavity within the carrier substrate. For example, the lower portion 120 of the cavity and the upper portion 150 of the cavity may be located (vertically, directly) adjacent to the heater carrier structure 130. For example, the upper portion 150 of the cavity may be located (directly) adjacent to the cover structure 160. For example, the carrier substrate 110 may form at least one (or all) side wall(s) of the lower portion 120 of the cavity. Alternatively or additionally, an oxide layer may form at least one (or all) side wall(s) of the lower portion 120 of the cavity. For example, an oxide layer may form the side walls of the upper portion 150 of the cavity. For example, a side wall of the (lower or upper portion of the) cavity may correspond to a wall of the cavity extending between the heater carrier structure 130 and one of the cover structure 160, a lateral surface of the carrier structure, an optical filter structure and a reflector structure. For example, a bottom surface of the lower portion 120 of the cavity (e.g. a surface within the lower portion 120 of the cavity located at a side of the lower portion opposite from the heater carrier structure 130) may be formed by one of the carrier substrate, a reflector structure and an optical filter structure. For example, the cavity may be an evacuated cavity (e.g. comprising a vacuum or a gas).

For example, the lower portion 120 of the cavity may comprise a vertical height of more than 1 µm (or more than 10 µm, more than 50 µm, more than 100 µm, more than 200 µm, more than 400 µm). For example, the lower portion 120 of the cavity may comprise a vertical height of less than 600 µm (or less than 500 µm, less than 200 µm, less than 100 µm, less than 50 µm, less than 20 µm, less than 10 µm). For example, the upper portion 150 of the cavity may comprise a vertical height of more than 0.05 µm (or more than 0.1 µm, more than 0.5 µm, more than 1 µm, more than 2 µm, more than 5 µm). For example, the upper portion 150 of the cavity may comprise a vertical height of less than 15 µm (or less than 10 µm, less than 8 µm, less than 5 µm, less than 3 µm, less than 2 µm, less than 1 µm, less than 0.5 µm). For example, the upper portion of the cavity may comprise a lateral width at least 5 times (or at least 10 times, at least 20 times, at least 50 times, at least 80 times) as large as an (average, vertical) thickness of the upper portion of the cavity.

For example, a (quasi-)vacuum may be formed in the cavity. For example, a gas pressure in the cavity may be greater than 0.001 mbar or greater than 0.01 mbar. For example, a gas pressure in the upper portion 150 of the cavity may be equal to a gas pressure in the lower portion 120 of the cavity. The cavity may be filled with air or with a gas having a lower thermal conductivity than air (e.g. radon, xenon, or argon), for example.

For example, the cover structure 160 may form a substantially planar surface at a front-side surface of the light emitter device, which may enable light emitter devices with reduced dimensions. For example, the cover structure 160 may form a planar surface (a surface with a variation in height of less than 10 µm) over more than 70% (or more than 80%, more than 90%) of the surface of the cover structure (or over more than 70% (or more than 80%, more than 90%) of a front side surface of the light emitter device 100). For example, the cover structure may form a (front-side) lid of the light emitter device. For example, the cover structure 160 may comprise at least one semiconductor layer and/or at least one metal layer. For example, the cover structure may form at least a part of a front-side surface of the light emitter device 100. For example, the cover structure 160 may comprise a (silicon) oxide (chem. symbol $SiO_2$) layer at a lateral surface facing away from the carrier structure 110.

For example, the light emitter device may comprise an optical filter structure configured so that light passing the optical filter structure comprises a spectral maximum at a desired optical wavelength when the optical filter structure is implemented by the cover structure or is located between the lower portion of the cavity and a back-side surface of the light emitter device (e.g. adjacent to the lower portion 120 of the cavity or at the back side surface of the carrier substrate.). Integrating an optical filter structure into the cover structure may enable a further integration of components onto the carrier substrate, enabling more compact dimensions of the light emitter device.

For example, the optical filter structure may comprise a transmissivity of more than 70% or more than 80%, more than 90% at the desired optical wavelength, and a transmissivity of less than 20% (or less than 10%, less than 5%) at optical wavelengths at least 5% (or at least 10%) larger or smaller than the desired optical wavelength. For example, the desired optical wavelength may be within an infrared spectrum. For example, the desired optical wavelength may be between 1 µm and 10 µm (or between 4 µm and 5 µm, or between 4.2 m and 4.5 µm). For example, the desired optical wavelength may correspond to an optical wavelength absorbed by a sample gas in a gas detector. For example, the optical filter structure may comprise a thickness of less than 25 µm (or less than 20 µm, less than 15 µm, less than 10 µm, less than 5 µm, less than 3 µm). For example, the optical filter structure may comprise a thickness of more than 1 µm (or more than 2 µm, more than 5 µm, more than 10 µm).

Figure 8A:
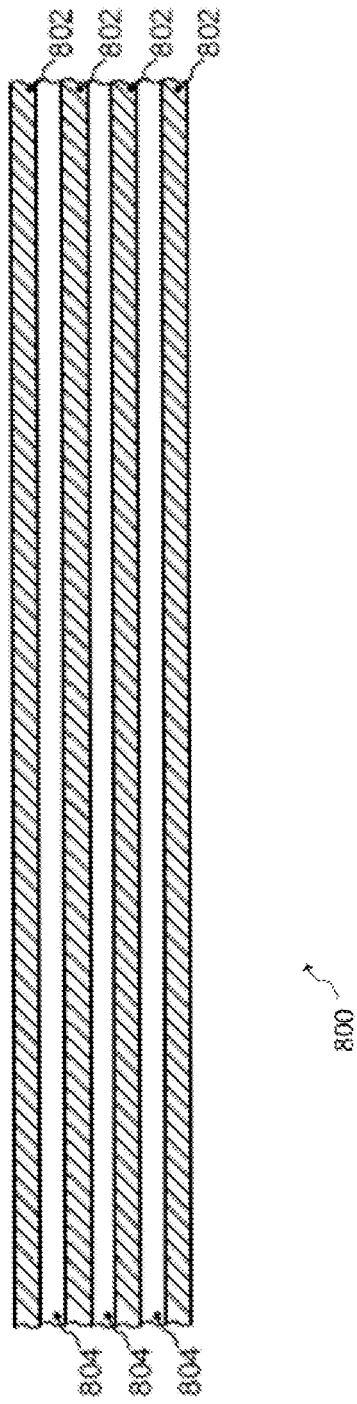

For example, the optical filter structure may comprise a plurality of semiconductor layers of a filter layer stack and a plurality of insulation layers (e.g. silicon oxide or silicon nitride layers) or cavity layers of the filter layer stack (e.g. arranged (located) alternatingly to the semiconductor layers of the plurality of semiconductor layers). For example, the optical filter structure may comprise a Bragg filter with different polysilicon layers and/or insulating layers (e.g. layers comprising silicon oxide or silicon nitride). A multi-layer optical filter structure may enable a filter structure with a reduced thickness compared to other optical filter concepts, enabling more compact dimensions of the light emitter device. For example, the plurality of semiconductor layers may comprise fewer than 15 (or fewer than 12, fewer than 10, fewer than 8) semiconductor layers. For example, the plurality of semiconductor layers may comprise an increasing number of semiconductor layers to achieve a more pronounced demarcation of the desired wavelength from adjacent wavelengths (e.g. to demarcate an optical wavelength absorbed by carbon dioxide from optical wavelengths absorbed by water). FIG. 8A shows an example of an optical filter structure. For example, a top layer of the plurality of semiconductor layers and a bottom layer of the plurality of semiconductor layers may vertically enclose the plurality of insulation layers or cavity layers. For example, the filter structure may laterally overlap the cavity.

A thickness of the semiconductor layers of the plurality of semiconductor layers may be less than 2 µm (or less than 1.5 µm, less than 1 µm, less than 0.8 µm) and a thickness of the insulation layers or of the cavity layers of the plurality of insulating layers or cavity layers may be less than 4 µm (or less than 3 µm, less than 2 µm, less than 1.5 µm, less than 1 µm, less than 0.8 µm) so that light passing the filter layer stack comprises a spectral maximum at the desired optical wavelength.

Figure 3:
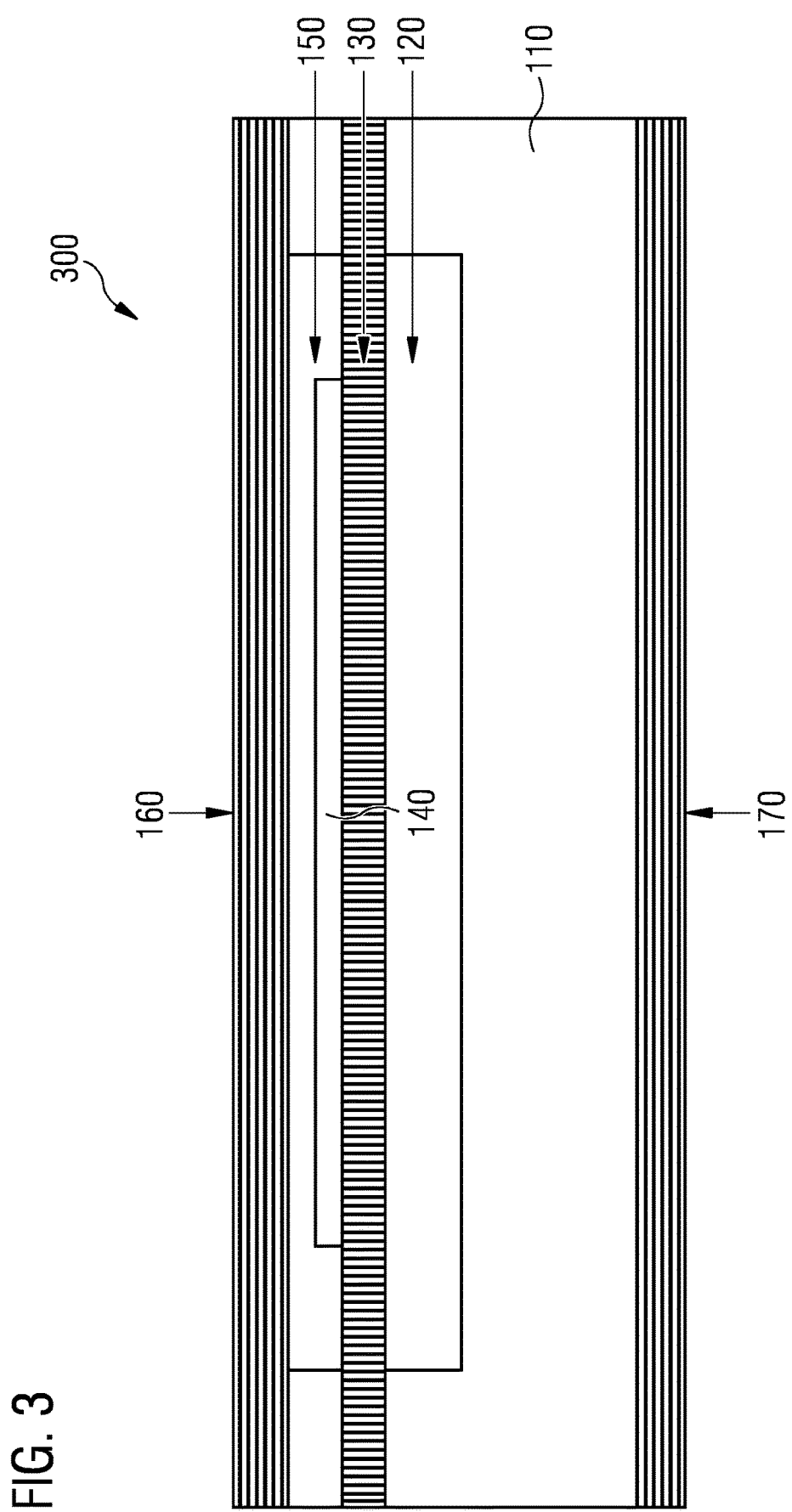
FIG. 3-4 show schematic cross section of examples of light emitter devices.
Figure 4:
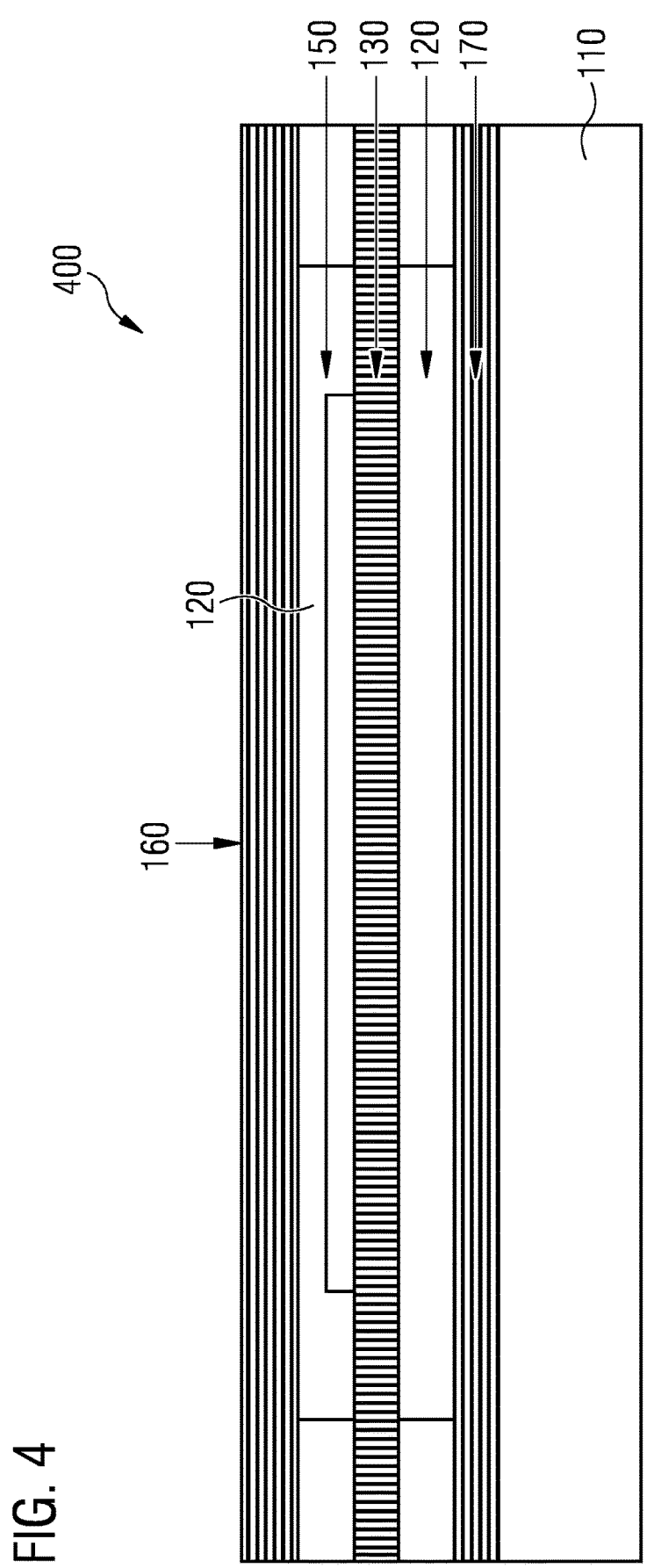

For example, the light emitter device may further comprise a reflector structure configured to reflect at least 70% (or at least 80%, at least 90%, at least 95%) of light within a desired spectral range (e.g. at the desired optical wavelength or at a range extending from 95% of the desired wavelength to 105% of the desired wavelength) emitted (vertically) towards the reflector structure by the heater structure (as shown in FIG. 3 or 4), e.g. at the desired wavelength. The reflector structure may reflect light emitted towards a side of the light emitter device not designated for emitting light, resulting in a reduced power consumption and less heat generated by the heater structure. For example, the reflector structure may be located at a back-side of the carrier substrate (e.g. as shown in FIG. 3). Alternatively, the reflector structure may be located between the lower portion of the cavity and the carrier structure, e.g. adjacent to the lower portion 120 of the cavity (e.g. as shown in FIG. 4). Alternatively, the reflector structure may be implemented by the cover structure 160. For example, the reflector structure may be located at an opposite side of the heater structure 140 with respect to the optical filter structure.

As a rear side reflector, a metal (e.g. aluminum, 80 to 900 percent reflection) layer may be used. For example, the reflector structure may comprise a metal film (e.g. aluminum). Alternatively, a dielectric layer stack may be used. An example for a dielectric layer stack may be shown in FIG. 5. The reflector structure may comprise a plurality of semiconductor layers of a reflector layer stack and a plurality of insulation layers or cavity layers of the reflector layer stack located/arranged alternatingly to the semiconductor layers of the plurality of semiconductor layers. A multi-layer reflector structure may enable a reflector structure with an improved reflectivity compared to other reflector concepts. A thickness of the semiconductor layers of the plurality of semiconductor layers may be less than 2 µm (or less than 1.5 µm, less than 1 µm, less than 0.8 µm) and a thickness of the insulation layers or cavity layers of the plurality of insulation layers or cavity layers may be less than 4 m (or less than 3 µm, less than 2 µm, less than 1.5 µm, less than 1 µm, less than 0.8 µm) so that at least 70% (or at least 80%, at least 90%, at least 95%) of light that is vertically incident to the reflector layer stack is reflected within the desired spectral range or at a desired optical wavelength (e.g. at the desired optical wavelength of the optical filter structure). For example, a thickness of layers of the reflector layer stack may differ from a thickness of layers of the filter layer stack, e.g. to achieve different optical properties for the reflector layer stack and the filter layer stack.

For example, the light emitter device may comprise a heater wiring structure connecting the heater structure 140 to a contact pad structure or a heater driver circuit. For example, the heater wiring structure may comprises one or more conductive layers, one or more vias and/or one or more wires. Portions of the heater wiring structure arranged on the carrier structure 130 may have a resistivity of less than 50% (or less than 40%, less than 20%, less than 10%, less than 10%) of a resistivity of the heater structure (e.g. due to an increased concentration of implanted ions). A reduced resistivity may result in a reduced conduction of heat. For example, the heater wiring structure may comprise two or more contact structures located at a surface of the cover structure 160.

The flow of the predefined current through the heater structure 140 may cause a Joule heating of the heater structure 140 and may thereby lead to an emission of heat radiation by the heater structure 140, for example. For example, the heater structure 140 may be configured to emit infrared light (e.g. light with a wavelength in the range of 700 nm to 1 mm), visible light (e.g. light with a wavelength in the range of 400 nm to 700 nm) and/or a combination thereof. For example, the heater structure 140 may be configured to emit light with a spectrum comprising a maximal intensity at a wavelength greater than 700 nm and less than 1 mm (e.g. between 4 µm and 5 µm, or between 4.2 µm and 4.5 µm).

For example, the heater structure 140 may be arranged on or under the heater carrier structure 130 (e.g. at a front side or a back side of the heater carrier structure). For example, the heater structure 140 may be located within the upper portion 150 of the cavity or within the lower portion 120 of the cavity. For example, at least a portion of the heater structure 140 may have a meander shape or a ring shape. In this way, a length of the heater structure 140 may be increased. By this, an electrical resistance of the heater structure 140 and thereby a Joule heating of the heater structure 140 due to the flow of the predefined current may be increased. In this way, an intensity of the emission of light may be increased. For example, the heater structure 140 may comprise polysilicon. Alternatively, the heater structure 140 may comprise a doped monocrystalline silicon.

For example, the flow of the predefined current may be generated by applying a voltage to electrical contacts of the heater structure 140. For example, the predefined current may be less than 10 mA (or less than 1 mA, less than 0.1 mA, less than 0.01 mA, or less than 1 µA). The predefined current may be supplied by a supply circuit, a control circuit or a heater driver circuit implemented on the carrier substrate 110 or by an external supply circuit. The light emitter device may further comprise a heater driver circuit (e.g. implemented on and/or at least partially within the carrier substrate) configured to provide the predefined current to the heater structure to cause a light emission by the heater structure. The heater driver circuit may be implemented at the carrier substrate, e.g. on the carrier substrate or at least partially within the carrier substrate 110. The control circuit being integrated on the carrier substrate may further reduce a size of the light emitter device.

For example, the light emitter device may further comprise a package structure comprising the carrier substrate 110, the heater carrier structure 130, the heater structure 140, the cavity and the cover structure 160. For example, the package structure might not be in direct contact with the cover structure 160. For example, the package structure may be arranged with a distance of at least 500 nm (or at least 1 μm, at least 10 μm) to the cover structure 160. For example, at least 50% (or at least 70%, at least 80%, at least 90%) of the cover structure 160 may be unshielded by the package structure.

For example, the carrier substrate 110 may be semiconductor substrate (e.g. a silicon (based) (chem. symbol Si) substrate) or a glass substrate. A semiconductor substrate may be a semiconductor wafer or a semiconductor die or a part of a semiconductor wafer or a semiconductor die, for example. For example, a glass substrate may be a silica (e.g. $SiO_2$) based glass substrate, a borosilicate based glass substrate, an aluminosilicate based glass substrate, or an oxide based glass substrate. A glass substrate may be a glass wafer, a glass lid wafer, or a glass lid or a part of a glass wafer, a glass lid wafer, or a glass lid, for example. The front side surface of the carrier substrate 110 may be the surface of the carrier substrate 110 facing towards the heater carrier structure 130, and the back-side surface of the carrier substrate 110 may be the surface of the carrier substrate 110 facing away from the heater carrier structure. For example, the front side surface of the light emitter device 100 may be the surface of the light emitter device at least partially formed by the cover structure. For example, the back-side surface of the light emitter device 100 may correspond to the back-side surface of the carrier substrate 110 or to an outward-facing surface of a reflector structure located at the back-side surface of the carrier substrate 110.

For example, a vertical direction may be measured orthogonal to the front or back side surface of the carrier substrate 110 and a lateral direction may be measured in parallel to the front or back side surface of the carrier substrate 110.

For example, the light emitter device 100 may be an element of a photoacoustic gas sensor, a photoacoustic spectroscopy system, a thermal flow sensor, or a mobile device (e.g. a smartphone or a tablet computer). For example, the light emitter device 100 may be a light source of a gas detection apparatus. The light emitter device 100 may be used to realize any other gas sensor principle, where emitted optical radiation is used to trigger a sensor effect (e.g. a photoacoustic effect) such as NDIR (Non-Dispersive Infra-Red) sensor systems, for example.

FIG. 2 shows a schematic top view of an example of a heater carrier structure 130 located within a cavity. The heater carrier structure 130 of FIG. 2 comprises a plurality of holes 132 arranged in a plurality of rows of holes, and a plurality of stripes 134. The plurality of holes 132 of the plurality of rows of holes comprise an elongated lateral shape oriented in parallel to the row. In the example of FIG. 2, two neighboring stripes of the plurality of stripes 134 are laterally connected by lateral connecting bars 136 of solid material separating holes 132 of a row of the plurality of rows of holes located between the two neighboring stripes. The plurality of rows of holes 132 and the plurality of stripes 134 are arranged alternatingly. Holes 132 of neighboring rows of the plurality of rows of holes comprise a lateral offset of more than 20% of a length of a hole of the neighboring rows. FIG. 2 may show a schematic drawing of a patterned oxide that spans over a cavity in a silicon substrate.

It may be mentioned that the pattern shown in FIG. 2 may reduce thermal losses (severely). Heat conductance that extends sideways may be guided in a serpentine run. In this way, thermal losses may be kept at a very low level. A band pass filter may be placed over a construction of this support and a thermal emitter (highly doped silicon resistors). In this way, the filter may offer an intrinsic sealing of the emitter/filter unit with an evacuated cavity.

More details and aspects of the carrier structure 130 are mentioned in connection with the proposed concept or one or more examples described above (e.g. FIG. 1). The carrier structure 130 may comprise one or more additional optional features corresponding to one or more aspects of the proposed concept or one or more examples described above or below.

FIG. 3 shows a schematic cross section of a light emitter device 300. The light emitter device 300 may be implemented similar to a light emitter device introduced in connection with FIG. 1. The light emitter device 300 comprises a heater structure (e.g. a light emitting structure) 140 configured to emit light if a predefined current flows through the heater structure 140. The heater structure is arranged on a heater carrier structure 130. The light emitter device 300 comprises an upper portion 150 of a cavity located vertically between the heater carrier structure 130 and a cover structure 160 comprising an optical filter structure. The light emitter device 300 comprises a lower portion 120 of the cavity located vertically between the heater carrier structure 130 and at least a portion of a carrier substrate 110. The light emitter device 300 further comprises a reflector structure 170 located at a back-side surface of the carrier substrate 110. FIG. 3 may illustrate a schematic diagram of an emitting unit for IR (infrared) spectral sensors.

More details and aspects of the light emitter device 300 are mentioned in connection with the proposed concept or one or more examples described above (e.g. FIG. 1 to 2). The light emitter device 300 may comprise one or more additional optional features corresponding to one or more aspects of the proposed concept or one or more examples described above or below.

FIG. 4 shows a schematic cross section of a light emitter device 400. The light emitter device 400 may be implemented similar to a light emitter device introduced in connection with FIG. 1. The light emitter device 400 comprises a heater structure (e.g. a light emitting structure) 140 configured to emit light if a predefined current flows through the heater structure 140.

The heater structure is arranged on a heater carrier structure 130. The light emitter device 400 comprises an upper portion 150 of a cavity located vertically between the heater carrier structure 130 and a cover structure 160 comprising an optical filter structure. The light emitter device 400 comprises a lower portion 120 of the cavity located vertically between the heater carrier structure 130 and at least a portion of a carrier substrate 110. The light emitter device 400 further comprises a reflector structure 170 located between the lower portion 120 of the cavity and the carrier substrate 110. FIG. 4 may show a schematic cross section of a rear side filter on top of a silicon substrate as a pure surface micro machined design.

More details and aspects of the light emitter device 400 are mentioned in connection with the proposed concept or one or more examples described above (e.g. FIG. 1 to 3). The light emitter device 400 may comprise one or more additional optional features corresponding to one or more aspects of the proposed concept or one or more examples described above or below.

Figure 5:
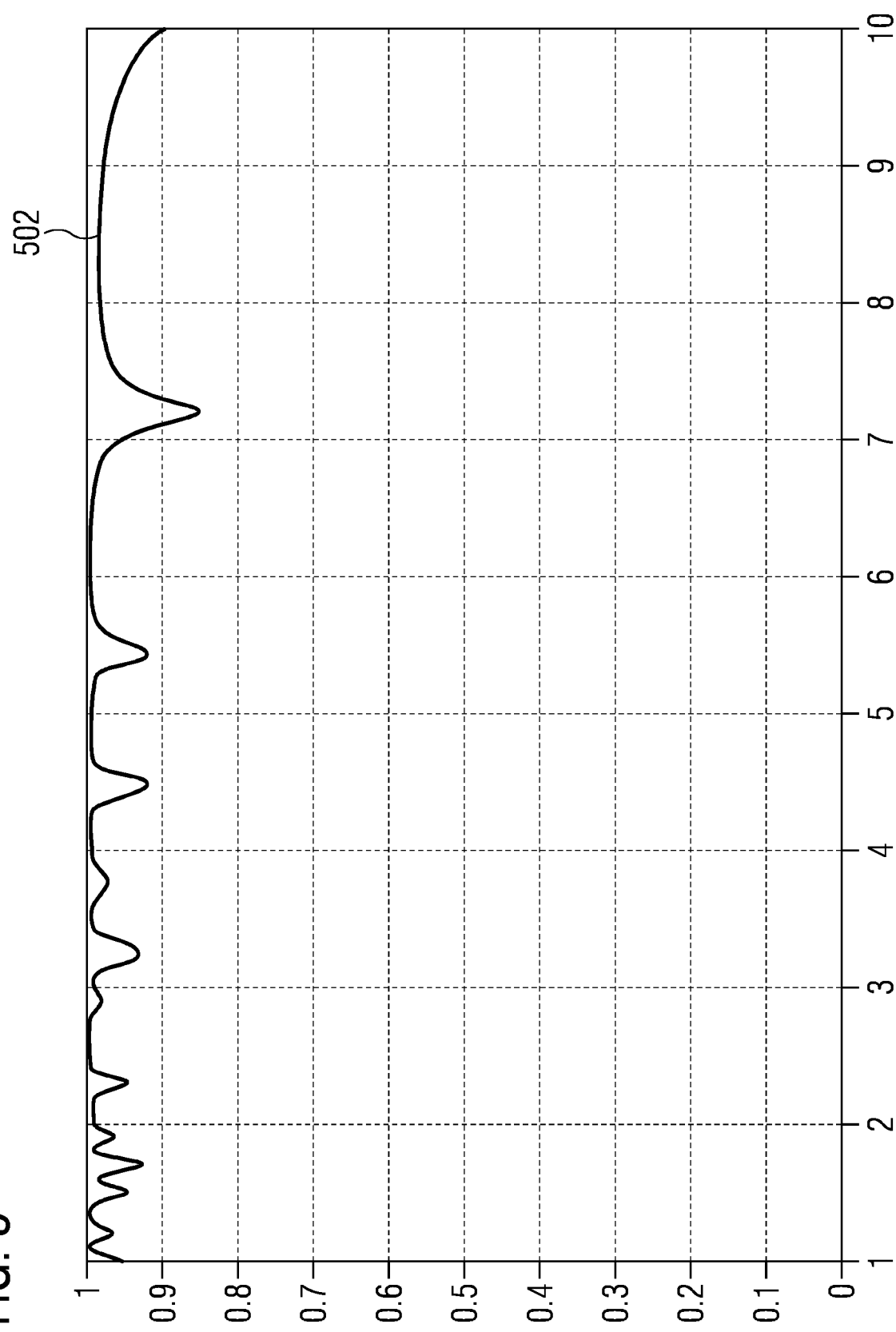
FIG. 5 shows a diagram of a reflectivity of a rear side reflector on a silicon substrate.

FIG. 5 shows a diagram of a reflectivity of a rear side reflector on a silicon substrate (made of silicon and air or vacuum) with an average reflectivity of 97.7% (at a wavelength of 1 to 10 microns). The rear side reflector may be implemented similar to a reflector structure introduced in connection with one of the FIGS. 1, 3 and 4. The diagram shows a reflectivity (on a scale from 0 to 1) on the y axis and a wave length in microns on the x axis. The graph 502 shows a reflectivity of a multi-layer reflector structure for a range of wavelengths between 1 μm and 10 μm. The multi-layer reflector structure of FIG. 5 comprises 5 silicon layers, each with a thickness between 200 and 1000 nm and 5 cavity layers comprising air, each with a thickness between 400 nm and 1000 nm.

More details and aspects of the reflector (structure) are mentioned in connection with the proposed concept or one or more examples described above (e.g. FIG. 1 to 4). The reflector (structure) may comprise one or more additional optional features corresponding to one or more aspects of the proposed concept or one or more examples described above or below.

Figure 6:
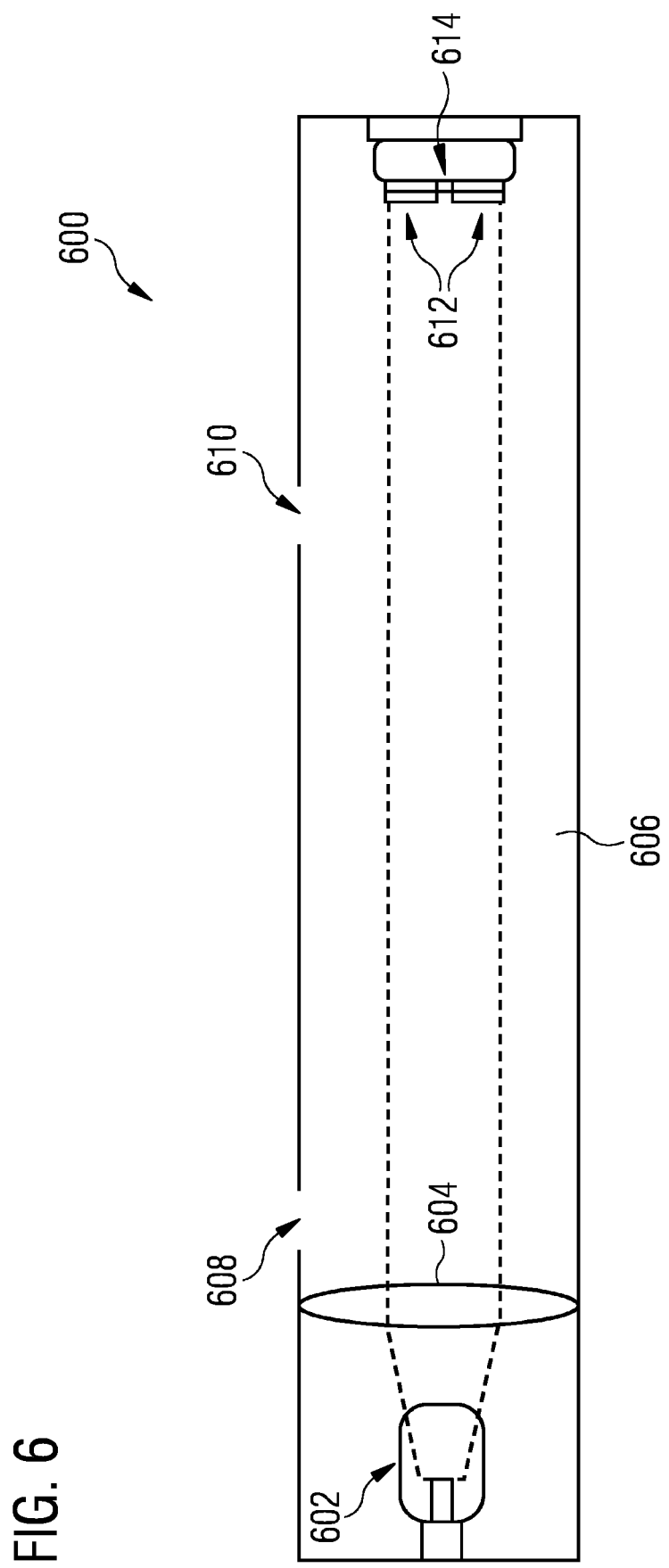
FIG. 6 shows a schematic cross section of a gas sensor apparatus.

FIG. 6 shows a schematic cross section of a (linear non-dispersive) gas sensor apparatus 600. The gas sensor apparatus 600 comprises a (broadband) infrared source 602 (e.g. a light emitter device as introduced in connection with one of the FIGS. 1, 3 and 4), a lens 604, a measurement chamber 606 with a gas inlet 608 and a gas outlet 610, dual filters 612 and a dual element detector 614. FIG. 6 may show a schematic diagram of a linear non-dispersive gas sensor with an optical path length in the range of centimeters.

More details and aspects of the gas sensor apparatus 600 are mentioned in connection with the proposed concept or one or more examples described above (e.g. FIG. 1 to 5). The gas sensor apparatus 600 may comprise one or more additional optional features corresponding to one or more aspects of the proposed concept or one or more examples described above or below.

Figure 7:
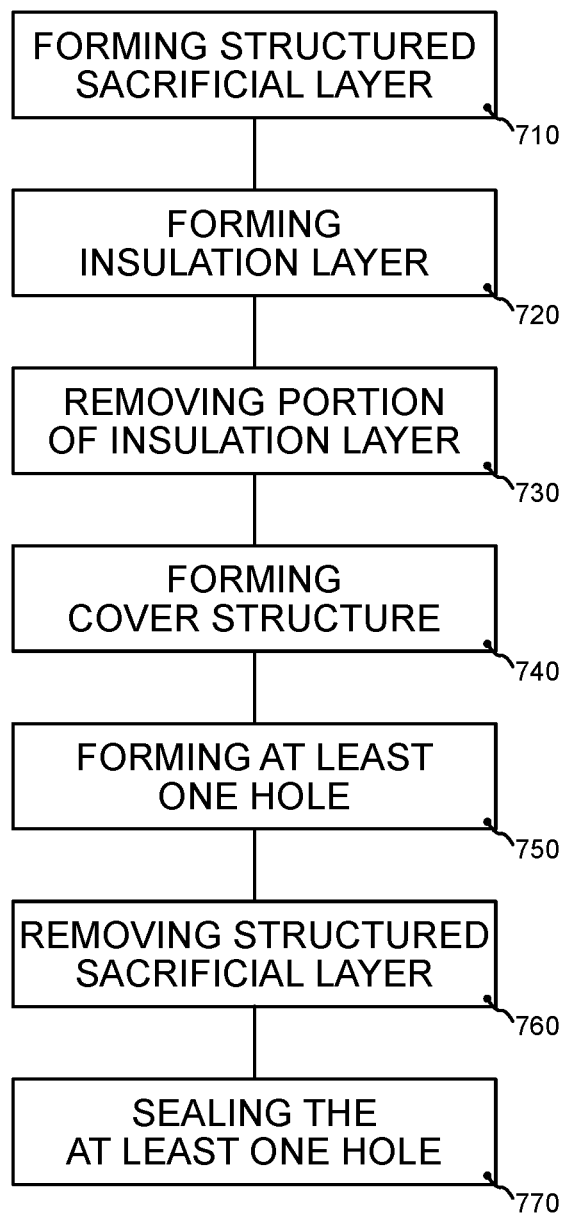
FIG. 7 shows a flow chart of a method for forming a light emitter device.

FIG. 7 shows a flow chart of a method 700 for forming a light emitter device. The method comprises forming 710 a structured sacrificial layer above a heater carrier structure 130. A heater structure 140 is arranged at the heater carrier structure 130. The method comprises forming 720 an insulation layer on the structured sacrificial layer. The method comprises removing 730 a portion of the insulation layer until the structured sacrificial layer is uncovered to obtain a smooth surface. The method comprises forming 740 a cover structure on the smooth surface. The method comprises forming 750 at least one hole through the cover structure to the structured sacrificial layer. The method comprises removing 760 the structured sacrificial layer to obtain a cavity between the heater carrier structure 130 and the cover structure. The method comprises sealing 770 the at least one hole at an ambient pressure of less than 100 mbar (or less than 10 mbar, less than 1 mbar, less than 0.1 mbar, less than 0.01 mbar).

The method 700 may enable the forming of the light emitter device so that the cavity comprises a pressure of less than 100 mbar, enabling an improved heat isolation between the heater structure and walls of the cavity.

For example, the forming 710 of the structured sacrificial layer may comprise forming of an unstructured sacrificial layer, e.g. depositing of the unstructured sacrificial layer, and subsequent structuring of the unstructured sacrificial layer to obtain the structured sacrificial layer. For example, the structuring of the unstructured sacrificial layer may comprise removing parts of the unstructured sacrificial layer based on a mask configured to shield portions of the sacrificial layer from an etching process. For example, the structured sacrificial layer may be carbon-based and/or comprise carbon (chem. symbol C).

For example, the forming 720 of the insulation layer may comprise depositing the insulating layer on the structured sacrificial layer. For example, the insulation layer may comprise silicon oxide. For example, the insulation layer may be formed with a thickness at least 50% (or at least 80%, at least 100%, at least 150%) larger than a thickness of the structured sacrificial layer, enabling a subsequent chemical-mechanical polishing step.

For example, the portion of the insulation layer may be removed by chemical-mechanical polishing of the insulation layer until the structured sacrificial layer is uncovered to obtain the smooth surface. The chemical-mechanical polishing may enable the forming of the smooth surface, which may enable a forming of a (substantially) planar cover structure. For example, the chemical-mechanical polishing may use the uncovering of the structured sacrificial layer as a trigger to stop the chemical-mechanical polishing. For example, the removing 730 of the portion of the insulation layer may further comprise removing a portion of the structured sacrificial layer, e.g. a portion of the structured sacrificial layer extending further from the carrier substrate than the insulation layer after the removing of the portion of the insulation layer. For example, the smooth surface may correspond to a surface formed by a remaining portion of the insulation layer (after the removing 730 of the portion of the insulation layer) and (a remaining portion of) the structured sacrificial layer (e.g. after removing a portion of the structured sacrificial layer during the removing 730 of the portion of the insulation layer). For example, a level of the smooth surface (a height/thickness of the front side surface of the light emitter device at the smooth surface) may vertically deviate by less than 2 μm (or less than 1 μm, less than 500 nm, less than 200 nm) over the smooth surface.

Figure 10:
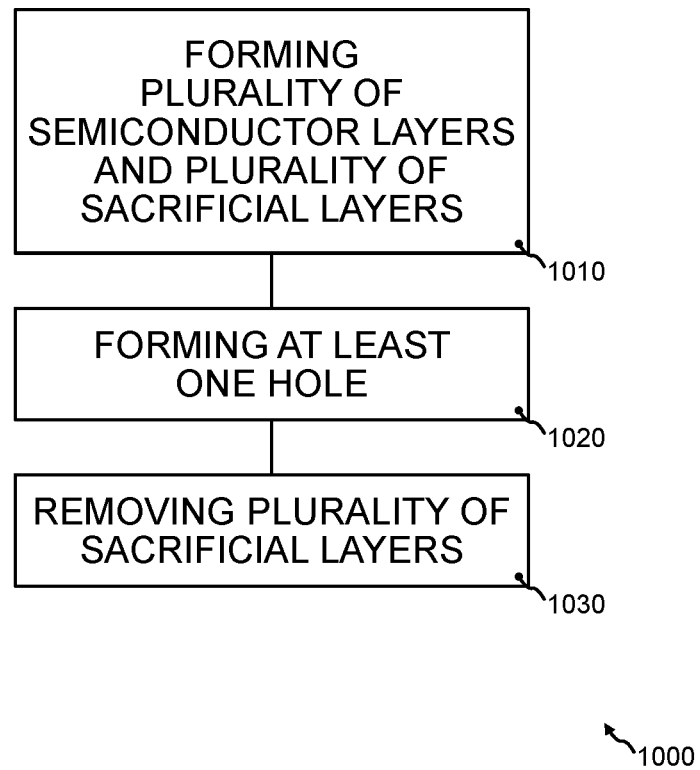

For example, the forming 740 of the cover structure may comprise depositing or attaching one or a plurality of layers (e.g. semiconductor layers or metal layers) on/to the insulation layer and the structured sacrificial layer. For example, the forming 740 of the cover structure may comprise forming an optical filter structure (e.g. as shown in FIG. 10).

For example, the forming 750 of the at least one hole may comprise etching the at least one hole through the cover structure. For example, if the cover structure (e.g. an optical filter structure) comprises a plurality of semiconductor layers and a plurality of sacrificial layers/insulating layers (e.g. silicon layers and carbon or silicon oxide layers, respectively), the forming 750 of the at least one hole may comprise etching the at least one hole by a mutual etching process using the same etchant may for etching the plurality of semiconductor layers and the plurality of sacrificial layers/the plurality of insulating layers. For example, forming of the at least one hole may form a hole with a diameter of more than 100 nm (or more than 200 nm, more than 500 nm) and less than 5 μm (or less than 2 μm, less than 1 μm, less than 750 nm).

The method comprises removing 760 the structured sacrificial layer to obtain a cavity between the heater carrier structure 130 and the cover structure. For example, the removing 760 of the structured sacrificial layer may comprise etching the structured sacrificial layer, e.g. using a dry etching process and/or an isotropic etching process. For example, if the structured sacrificial layer is carbon-based, the removing 760 of the structured sacrificial layer may comprise plasma ashing (e.g. using an oxygen plasma) the structured sacrificial layer. For example, the removing 760 of the structured sacrificial layer may remove the structured sacrificial layer and a plurality of sacrificial layers of the optical filter structure (used as cover structure) using a mutual etching process, e.g. using a same etchant. For example, the obtained cavity may correspond to an upper portion of a cavity as shown in FIG. 1.

For example, the method may further comprise forming the heater carrier structure 130. For example, the forming of the heater carrier structure may comprise depositing an unstructured heater carrier structure and structuring of the unstructured heater carrier structure (e.g. of a plurality of holes extending through the heater carrier structure) to obtain the heater carrier structure. For example, the heater carrier structure may comprise a single layer (e.g. a single insulation layer). For example, the heater carrier structure may comprise or be of insulation material, e.g. an oxide (e.g. silicon oxide, $SiO_2$) or a nitride (e.g. silicon nitride ($Si_3N_4$)). For example, the method may further comprise forming a further cavity (e.g. into the carrier substrate or between walls of insulation material) and forming a sacrificial layer into the further cavity. The forming of the heater carrier structure 130 may form the heater carrier structure on at least the sacrificial layer, so that the heater carrier structure laterally overlaps the sacrificial layer. Alternatively, the forming of the heater carrier structure may form the heater carrier structure (directly) on a carrier substrate.

For example, the method may comprise forming (e.g. etching) a cavity below the heater carrier structure (e.g. a lower portion of a cavity further comprising the cavity between the heater carrier structure and the cover structure as upper portion of the cavity, as introduced in connection with FIG. 1) before forming the structured sacrificial layer or after removing the structured sacrificial layer. The cavity below the heater carrier structure (e.g. a lower portion of a cavity as shown in FIG. 1) may improve an isolation between the heater structure and the walls of the cavity. For example, the forming of the cavity below the heater carrier structure may comprise etching the cavity below the heater carrier structure through a plurality of holes extending vertically through the heater carrier structure (e.g. as introduced in connection with FIG. 1). For example, the forming of the cavity below the heater carrier structure 130 may form (e.g. by an (isotropic) etching process) the cavity below the heater carrier structure 130 into the carrier substrate. Alternatively, the forming of the cavity below the heater substrate may comprise removing (e.g. through an ashing process) a sacrificial layer (e.g. carbon) comprised in the cavity below the heater carrier structure 130. For example, the forming of the cavity below the heater carrier structure may use the heater carrier structure as a mask during an etching process (e.g. in a venetian etching process). For example, the forming of the cavity below the heater carrier structure may be implemented similar to the removing 760 of the structured sacrificial layer.

For example, the method may further comprise forming (e.g. depositing and structuring) the heater structure and/or a heater wiring structure. For example, the heater structure may comprise polysilicon or a (highly doped) monocrystalline silicon.

For example, the sealing 770 of the at least one hole may comprise depositing an oxide layer by a high density plasma depositing process to seal the at least one hole. For example, the sealing 770 of the at least one hole may form an (silicon) oxide layer over (the entire or a portion) of the cover structure. The sealing 770 of the at least one hole may seal the at least one hole by forming (e.g. depositing using high density plasma) a sealing layer (e.g. an (silicon) oxide or a (silicon) nitride) sealing the at least one hole.

More details and aspects of the method 700 are mentioned in connection with the proposed concept or one or more examples described above (e.g. FIG. 1 to 6). The method 700 may comprise one or more additional optional features corresponding to one or more aspects of the proposed concept or one or more examples described above or below.

FIG. 8 shows a schematic cross section of an optical filter structure 800 (e.g. a band-pass optical filter structure). For example, the optical filter structure may be implemented similar to an optical filter structure as introduced in connection with FIG. 1. The optical filter structure comprises a plurality of semiconductor layers 802 (e.g. silicon layers) of a filter layer stack. The optical filter structure comprises a plurality of cavity layers 804 of the filter layer stack arranged/located (vertically) alternatingly to the semiconductor layers of the plurality of semiconductor layers. A thickness of the semiconductor layers of the plurality of semiconductor layers is less than 2 µm (or less than 1.5 µm, less than 1 µm, less than 0.8 µm) and a thickness of the cavity layers of the plurality of cavity layers is less than 4 µm (or less than 3 µm, less than 2 µm, less than 1.5 µm, less than 1 µm, less than 0.8 µm) so that light passing the filter layer stack comprises a spectral maximum at a desired optical wavelength.

A multi-layer optical filter structure comprising a plurality of cavity layers may enable a construction of optical (bandpass) filters having improved filtering properties at a reduced thickness, enabling more compact dimensions of a light emitter device, for example.

For example, the plurality of semiconductor layers 802 may comprise fewer than 15 (or fewer than 12, fewer than 10, fewer than 8) semiconductor layers. The plurality of semiconductor layers 802 may comprise more than 4 (or more than 6, more than 8) semiconductor layers. For example, a cavity layer of the plurality of cavity layers 804 may be located (directly, vertically) adjacent to two neighboring semiconductor layers of the plurality of semiconductor layers 802. For example, a semiconductor layer of the plurality of semiconductor layers 802 may be located (directly, vertically) adjacent to at least one cavity layer of the plurality of cavity layers 804. For example, a pressure within the plurality of cavity layers 804 may be less than 100 mbar (or less than 10 mbar, less than 1 mbar, less than 0.1 mbar, less than 0.01 mbar). Using a low pressure (or near-vacuum) within the plurality of cavity layers may further improve the optical properties of the optical filter structure. For example, a (quasi-)vacuum may be formed within the plurality of cavity layers 804. For example, the plurality of cavity layers 804 may be mutually connected. For example, a gas pressure in the plurality of cavity layers 804 may be greater than 0.001 mbar or greater than 0.01 mbar. The plurality of cavity layers 804 may be filled with air or with a gas having a lower thermal conductivity than air (e.g. radon, xenon, or argon), for example. For example, the plurality of cavity layers 804 may be connected to a cavity of a light emitter device (e.g. as introduced in connection with FIG. 1) comprising the optical filter structure.

Figure 8B:
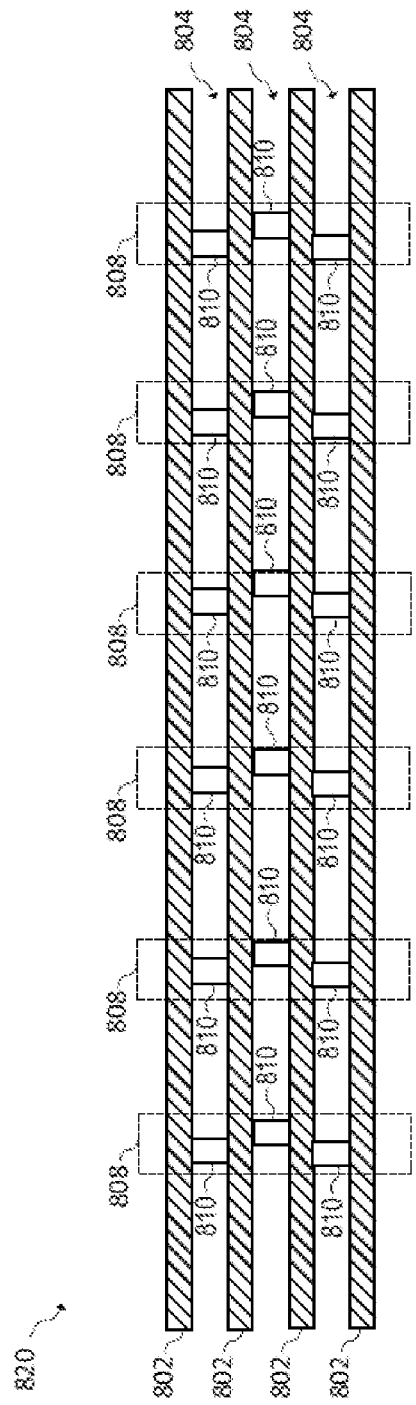

For example, the optical filter structure may further comprise a plurality of semiconductor pillars (piles) 808 connecting neighboring layers of the plurality of semiconductor layers 802 and extending through the cavity layers of the plurality of cavity layers 804 located between the neighboring semiconductor layers of the plurality of semiconductor layers 802 as shown in FIG. 8B. For example, a semiconductor pillar 808 of the plurality of semiconductor pillars 808 may be connected to at least two (or at least 3, at least 4, at least 8) of the semiconductor layers 802 of the plurality of the plurality of semiconductor layers 802. For example, a semiconductor pillar of the plurality of semiconductor pillars may be connected to all of the semiconductor layers of the plurality of the plurality of semiconductor layers 802. For example, a semiconductor pillar 808 of the plurality of semiconductor pillars 808 may be formed so that it connects neighboring semiconductor layers 802 of the plurality of semiconductor layers 802. For example, the plurality of semiconductor pillars 808 may interfuse the plurality of semiconductor layers 802. For example, a semiconductor pillar 808 of the plurality of semiconductor pillars 808 may comprise a plurality of sub-portions 810 located within the plurality of cavity layers 804. For example, the plurality of sub-portions 810 may laterally overlap (e.g. at least partially share a common lateral position on vertically different cavity layers 804 of the plurality of cavity layers 804). The plurality of pillars 808 may stabilize and keep apart the plurality of semiconductor layers 802. For example, a (maximal or average) lateral distance between the semiconductor pillars 808 (e.g. neighboring pillars) of the plurality of semiconductor pillars 808 may be smaller than 150 µm (or smaller than 100 µm, smaller than 80 µm) and/or larger than 10 µm (larger than 20 µm, larger than 30 µm, larger than 40 µm). For example, the plurality of semiconductor pillars 808 may be arranged in a grid or in a plurality of rows of semiconductor pillars 808. For example, each row of semiconductor pillars 808 may comprise two or more semiconductor pillars 808 of the plurality of semiconductor pillars 808. For example, a (maximal or average) lateral distance between the plurality of rows (e.g. neighboring rows) of semiconductor pillars 808 may be smaller than 150 µm (or smaller than 100 µm, smaller than 80 µm). For example, a (maximal or average) lateral distance between neighboring semiconductor pillars 808 within a row of semiconductor pillars may be smaller than 150 µm (or smaller than 100 µm, smaller than 80 µm).

To build a mechanically stable filter, a pattern of silicon piles may be used. These piles may be placed on the patterned oxide layer (e.g. the heater carrier structure shown in FIG. 2), and may interfuse the band pass filter. Due to their distance of several tens of microns, they might modify the simulated transmission spectrum (only) negligibly.

More details and aspects of the optical filter structure 800 are mentioned in connection with the proposed concept or one or more examples described above (e.g. FIG. 1 to 7). The optical filter structure 800 may comprise one or more additional optional features corresponding to one or more aspects of the proposed concept or one or more examples described above or below.

Figure 9:
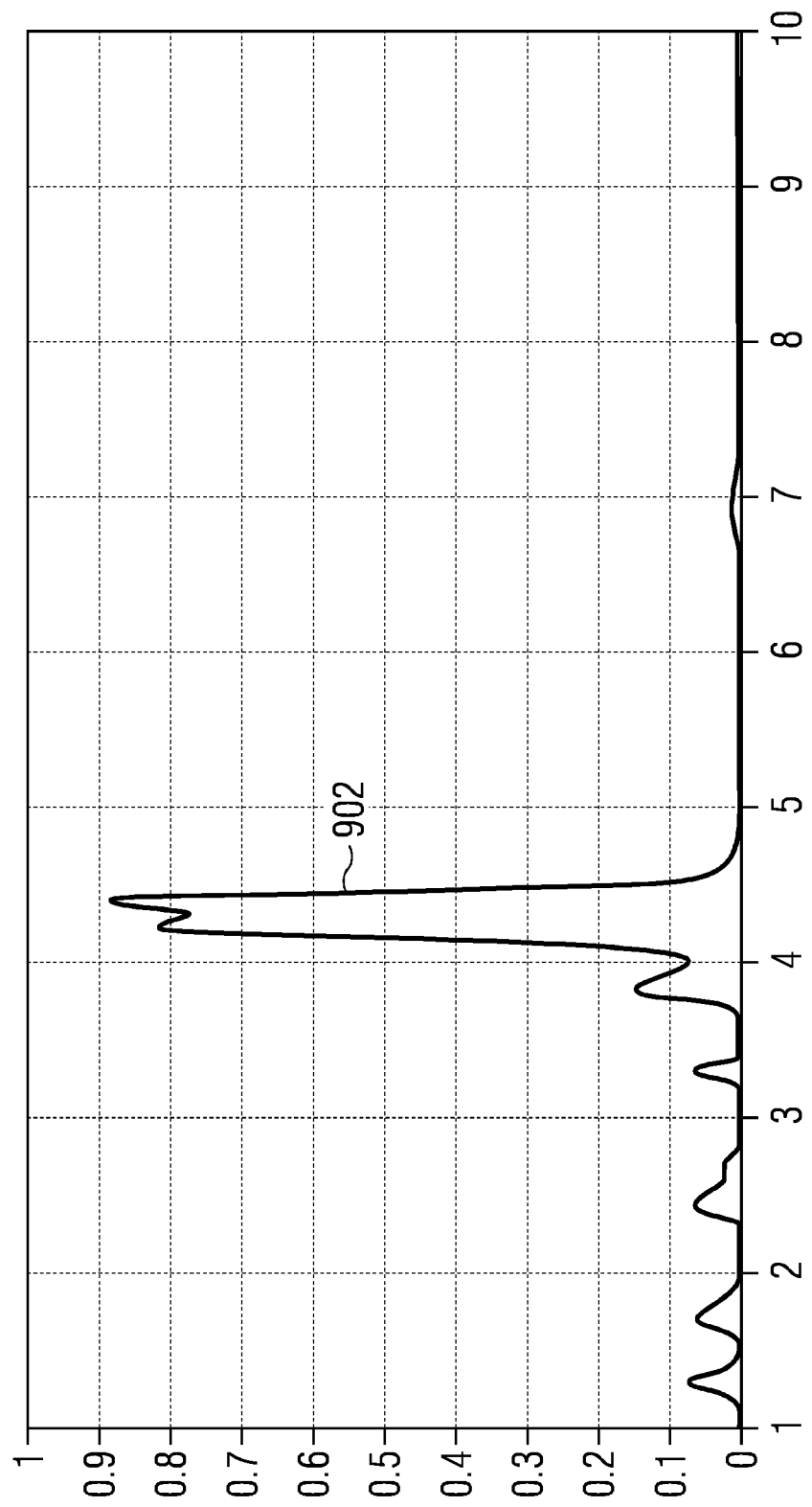
FIG. 9 shows a diagram of a transmissivity of an optical (multi-layer) filter structure on a silicon substrate; and, FIG. 10 shows a flow chart of a method for forming an optical filter structure.

FIG. 9 shows a diagram of a transmissivity of an optical (multi-layer) filter structure on a silicon substrate (made of silicon and vacuum). An example for an infrared filter stack may be calculated using silicon and vacuum for alternated optical layers. The thicknesses of single layers may be well within the means of processing capabilities of state-of-the-art layer deposition and etching. For example, a dry etchable sacrificial layer, such as carbon, may be used. FIG. 9 shows a simulated transmission spectrum 902 for a silicon/vacuum layer stack—improved for the carbon dioxide absorption band (roughly at 4.2 to 4.4 microns). FIG. 9 may further show a spectrum of an IR transmission filter (having a target peak at 4.3 microns). The x-axis shows a wave-length in microns, the y-axis shows a transmissivity. The graph 902 shows a transmissivity of an optical filter structure comprising a plurality of semiconductor (silicon) layers and a plurality of cavity layers (at vacuum) for different wavelengths, having a major transmissivity peak of >0.8 at wavelengths between 4.2 µm and 4.4 µm.

More details and aspects of the optical filter structure are mentioned in connection with the proposed concept or one or more examples described above (e.g. FIG. 1 to 8). The optical filter structure may comprise one or more additional optional features corresponding to one or more aspects of the proposed concept or one or more examples described above or below.

FIG. 10 shows a flow chart of a method 1000 for forming an optical filter structure. For example, the optical filter structure may be implemented similar to an optical filter structure introduced in connection with at least one of the FIGS. 1 and 8. The method 1000 for forming the optical filter structure may be implemented similar to a method for forming a light emitter device introduced in connection with FIG. 7. The method 1000 comprises forming 1010 a plurality of semiconductor layers (e.g. silicon layers) and a plurality of sacrificial layers (e.g. carbon layers) of an intermediate layer stack. The plurality of sacrificial layers is arranged/located alternatingly to the semiconductor layers of the plurality of semiconductor layers. The method 1000 further comprises forming 1020 at least one hole through the intermediate layer stack to at least a lowest sacrificial layer of the plurality of sacrificial layers. The method 1000 further comprises removing 1030 the plurality of sacrificial layers to obtain a filter layer stack comprising the plurality of semiconductor layers and a plurality of cavity layers arranged/located alternatingly to the semiconductor layers of the plurality of semiconductor layers. A (maximal or average) thickness of semiconductor layers of the plurality of semiconductor layers is less than 2 µm (or less than 1.5 µm, less than 1 µm, less than 0.8 µm) and a (maximal or average) thickness of cavity layers of the plurality of cavity layers is less than 4 µm (or less than 3 µm, less than 2 µm, less than 1.5 µm, less than 1 µm, less than 0.8 µm) so that light passing the filter layer stack comprises a spectral maximum at a desired optical wavelength.

The method may enable the forming of the optical filter structure with a plurality of cavity layers, enabling a construction of optical (band-pass) filters having improved filtering properties at a reduced thickness.

For example, the forming 1010 of the plurality of semiconductor layers and of the plurality of sacrificial layers may comprise alternatingly depositing (single) semiconductor layers of the plurality of semiconductor layers and depositing (single) sacrificial layers of the plurality of sacrificial layers. For example, the forming 110 of the plurality of semiconductor layers and of the plurality of sacrificial layers may comprise forming a first semiconductor layer of the plurality of semiconductor layers, forming a sacrificial layer of the plurality of sacrificial layers on the first semiconductor layer and forming a second semiconductor layer of the plurality of semiconductor layers on the sacrificial layer (and repeating the forming of the sacrificial layer and of the second semiconductor layer until the plurality of semiconductor layers and the plurality of sacrificial layers is formed). For example, the plurality of sacrificial layers may be carbon-based, e.g. may be carbon.

For example, the forming 1020 of the at least one hole may comprise etching the at least one hole by a mutual etching process using the same etchant for etching the semiconductor layers and for etching the sacrificial layers. The mutual etching process may reduce an amount of processing steps required for manufacturing the optical filter structure. For example, the etchant may be configured/chosen to etch both semiconductor layers of the plurality of semiconductor layers and sacrificial layers of the plurality of sacrificial layers.

For example, the removing 1030 of the plurality of sacrificial layers may comprise etching the plurality of sacrificial layers, e.g. using a dry etching process and/or an isotropic etching process. For example, if the plurality of sacrificial layers are carbon-based, the removing 1030 of the plurality of sacrificial layers may comprise plasma ashing (e.g. using an oxygen plasma) the plurality of sacrificial layers. For example, the intermediate layer stack may become the filter layer stack after the removing of the plurality of sacrificial layers.

For example, the method may further comprise sealing the at least one hole by forming (e.g. depositing using high density plasma) a sealing layer (e.g. an (silicon) oxide or a (silicon) nitride) sealing the at least one hole. The sealing of the at least one hole may comprise depositing an oxide layer by a high density plasma depositing process. The sealing of the at least one hole may enable a manufacturing of optical filter structure with a plurality of cavity layers with a pressure of less than 100 mbar (or less than 10 mbar, less than 1 mbar, less than 0.1 mbar, less than 0.01 mbar). For example, the sealing of the at least one hole may seal the at least one hole at an ambient pressure of less than 100 mbar (or less than 10 mbar, less than 1 mbar, less than 0.1 mbar, less than 0.01 mbar). For example, a pressure within the plurality of cavity layers may be less than 100 mbar (or less than 10 mbar, less than 1 mbar, less than 0.1 mbar, less than 0.01 mbar) after the sealing of the at least one hole. For example, the at least one hole may correspond to at least one hole as introduced in connection with FIG. 7. For example, the sealing of the at least one hole may seal the at least one hole of the optical filter structure and the light emitter device of FIG. 7.

More details and aspects of the method 1000 for forming the optical filter structure are mentioned in connection with the proposed concept or one or more examples described above (e.g. FIG. 1 to 10). The method 1000 for forming the optical filter structure may comprise one or more additional optional features corresponding to one or more aspects of the proposed concept or one or more examples described above or below.

Examples may provide an emitting unit (e.g. a light emitter device) for infrared light with a defined spectral distribution.

A constantly increasing amount of publication and concepts may deal with detection and characterization of chemicals in gases and other fluids. The progressive miniaturization of components of these measurement systems may pave the way for opening up new markets.

One prominent example may be the measurement of carbon dioxide concentrations in closed environments. The American Society of Heating, Refrigerating, and Air-Conditioning Engineers (ASHRAE) provided some insight into the role of demand controlled ventilation for buildings. "Carbon dioxide based demand controlled ventilation . . . could potentially become as common as thermostatic control is today . . . ".

Measurements of a carbon dioxide concentration in a ventilated room as a function of time ventilation rate as a parameter may illustrate the buildup of CO2 in buildings and cars over time. In buildings, at a ventilation rate of 3.5l/s per person, a concentration of CO2 may constantly increase over time, exceeding 2500 ppm (parts per million) over time. At a ventilation rate of 7.5l/s and 15 l/s, an equilibrium of carbon dioxide may level off at approximately 1000 ppm and 750 ppm, respectively. Within cars (based on measurements of a carbon dioxide concentration in an upper class car with stopped ventilation as a function of time, occupation as a parameter), the carbon dioxide level may also increase over time, approaching 10000 ppm with 4 persons located within the vehicle after 2000 s seconds (or 8000 ppm with 3 persons, 6000 ppm with 2 persons and 4000 ppm with 1 person).

Acceptable CO2 levels may be in the range of 60000 ppm, complaints of stiffness and odors may occur at 600 to 1000 ppm, general drowsiness may be associated with 1000-2500 ppm. For the case of carbon dioxide concentration in cars, ventilation may become a matter of safety. On the other hand, fuel efficiency may be one of the driving factors in car automation. Studies may estimate a reduction of fuel consumption at a level of up to 0.9 l/100 km when a sensor-controlled ventilation by demand is used instead of standard ventilation setups.

Heating at residential and public buildings is one major contributing factor of carbon dioxide emission in countries in temperate zones. In Germany, the associated consumption of energy may be roughly 7000 kWh per person and annum. This may correlate to a carbon dioxide emission of approx. 3.5 tons (assuming oil or natural gasoline as predominant energy sources). Although heating of buildings may be only a third of the overall energy consumption in Germany, the carbon dioxide emission for heating of buildings may be already well above the level of 2 tons per person and annum that may be acceptable concerning global warming. The reduction of efforts for heating of buildings may be connected with a gas-tight construction and demand controlled ventilation as a basis for efficient heat insulation.

There may be a need of sensor-controlled air quality management. There may be at least two sensor approaches as promising candidates for widespread usage in buildings: Non-dispersive infrared (NDIR) sensing systems and photoacoustic sensors. Although both systems may show sufficient resolution and key parameters, some improvements may be required, e.g. with respect to sensor dimensions, power consumption and costs.

Non-Dispersive Infrared (NDIR) $CO_2$ Sensor Systems: A broad range of sensing principles for gas detection has been investigated in the past decades. Among this variety, optical sensing as used in non-dispersive infrared (NDIR) $CO_2$ sensors may provide long-term stability and low cross-respond to other gas species. FIG. 6 shows a schematic diagram of a linear non-dispersive gas sensor with an optical path length in the range of centimeters.

One of the target research topics for NDIR sensors may have been the improvement and reduction of optical path lengths needed for carbon dioxide detection in the 100 ppm range. Some investigations may yield single components of NDIR sensors as integrated parts of a silicon chip. Principally, all components may be demonstrated separately as silicon dies. However, the improved usage of silicon physical properties concerning infrared wave guiding and spectral filtering is rarely exploited in more than one component.

The reduction of system dimensions and overall power consumption of infrared emitters may be one central task on the way to monolithically integrated gas sensors. An improved thermal isolation and filtering may be used in examples.

Examples may provide an emitting unit (e.g. a light emitter device 100 of FIG. 1) for infrared light with a defined spatial and spectral distribution. At least some examples may combine an integrated infrared emitter and a spectral filter as a single unit for emission of a spectrum of choice. This unit may be (at least partially) thermally isolated from the surrounding material by evacuated cavities. The principal components may be shown in FIGS. 1, 3 and/or 4. As can be seen in FIGS. 1,3 and/or 4, for example, the infrared light emitter may be directly placed in a trap (e.g. a cavity) that mainly lets a spectrum of choice pass through a filter sandwich. A patterned support (e.g. a heater carrier structure 130 of FIG. 1) may be used to reduce thermal losses.

At least some examples provide an infrared emitting unit that combines emitter and band pass filter in a way, that reduced thermal and radiation losses may occur. An evacuated cavity may surround the emitter (e.g. the heater structure). The filter (e.g. the optical filter structure or the cover structure) may be used as a sealing of the cavity. In this way, a patterned support can be used that may reduce lateral thermal conductance.

At least some examples provide an infrared emitting unit (e.g. the light emitter device) with an integrated bandpass filter (optical filter structure) on a silicon substrate (carrier substrate). At least some examples provide a patterned support layer (heater carrier structure) for a reduction of lateral thermal losses. At least some examples may comprise a rear side reflector (reflector structure) for enhanced emission efficiency, for example made of a silicon/air stack. Some examples may comprise a pillar fixture of filter stack on oxide support.

The above shown examples may be configured with parts omitted, such as an emitting unit without a filter system. Further on, other elements may be combined. One example is a rear side reflector above the silicon substrate as depicted in FIG. 4.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A system comprising:
an optical filter structure comprising:
a plurality of semiconductor layers of a filter layer stack; and
a plurality of cavity layers of the filter layer stack arranged alternatingly to the semiconductor layers of the plurality of semiconductor layers,
wherein a thickness of the semiconductor layers of the plurality of semiconductor layers is less than 2 µm and a thickness of the cavity layers of the plurality of cavity layers is less than 4 µm so that light passing the filter layer stack comprises a spectral maximum at a desired optical wavelength; and
a heater structure disposed within a cavity adjacent to the plurality of semiconductor layers of the filter layer stack.

2. The system according to claim 1, further comprising a plurality of semiconductor pillars connecting neighboring layers of the plurality of semiconductor layers and extending through the cavity layers of the plurality of cavity layers located between neighboring layers of the plurality of semiconductor layers.

3. The system of claim 2, wherein a semiconductor pillar of the plurality of semiconductor pillars comprises a plurality of sub-portions located within the plurality of cavity layers.

4. The system of claim 3, wherein the plurality of sub-portions laterally overlap.

5. The system of claim 3, wherein a lateral distance between semiconductor pillars of the plurality of semiconductor pillars is between 10 µm and 150 µm.

6. The system of claim 1, wherein the optical filter structure forms an optical band-pass filter.

7. The system of claim 1, further comprising a reflector structure, wherein the heater structure is disposed between the optical filter structure and the reflector structure.

8. The system of claim 7, further comprising a cavity disposed between the plurality of semiconductor layers of the filter layer stack and the reflector structure.

9. The system of claim 7, wherein the reflector structure is configured to reflect at least 70% of light within a predetermined spectral range emitted towards the reflector structure by the heater structure.

10. A device comprising:
an optical filter structure comprising
a plurality of semiconductor layers of a filter layer stack, and
a plurality of cavity layers arranged alternatingly with the plurality of semiconductor layers of the filter layer stack; and
a heater structure disposed within a cavity adjacent to the plurality of semiconductor layers of the filter layer stack, wherein the heater structure is configured to emit light when a predefined current flows through the heater structure.

11. The device of claim 10, wherein thicknesses of the plurality of semiconductor layers, the plurality of cavity layers are selected so that light passing the optical filter structure comprises a spectral maximum at a p an optical wavelength.

12. The device of claim 10, further comprising a reflector structure, wherein the heater structure is disposed between the optical filter structure and the reflector structure.

13. The device of claim 12, wherein the reflector structure configured to reflect at least 70% of light within a predetermined spectral range emitted towards the reflector structure by the heater structure.

14. The device of claim 10, further comprising a detector configured to receive the light emitted by the heater structure.

15. The device of claim 14, wherein the optical filter structure, the heater structure, and the detector form a gas sensor apparatus.

16. A method of using an optical filter structure comprising a plurality of semiconductor layers of a filter layer stack; and a plurality of cavity layers of the filter layer stack arranged alternatingly to the semiconductor layers of the plurality of semiconductor layers, wherein a thickness of the semiconductor layers of the plurality of semiconductor layers is less than 2 µm and a thickness of the cavity layers of the plurality of cavity layers is less than 4 µm so that light passing the filter layer stack comprises a spectral maximum at a predetermined optical wavelength, the method comprising:
receiving light, by the filter layer stack;
filtering the light by the filter layer stack; and
emitting the light by a heater structure disposed within a cavity adjacent to the plurality of semiconductor layers of the filter layer stack.

17. The method of claim 16, wherein emitting the light by the heater structure comprises emitting the light when a predefined current flows through the heater structure.

18. The method of claim 16, further comprising reflecting the emitted light by a reflector structure, wherein the heater structure is disposed between the optical filter structure and the reflector structure.

19. The method of claim 18, wherein the reflector structure is configured to reflect at least 70% of light within a predetermined spectral range emitted towards the reflector structure by the heater structure.

20. The method of claim 16, further comprising detecting the light emitted by the heater structure.

* * * * *

UNITED STATES PATENT AND TRADEMARK OFFICE
CERTIFICATE OF CORRECTION

PATENT NO. : 12,137,500 B2
APPLICATION NO. : 16/857400
DATED : November 5, 2024
INVENTOR(S) : Kautzsch et al.

Page 1 of 1

It is certified that error appears in the above-identified patent and that said Letters Patent is hereby corrected as shown below:

In the Claims

In Column 22, in Claim 11, Line 12, after "maximum at" delete "a p".

Signed and Sealed this
Fourteenth Day of January, 2025

Derrick Brent
*Acting Director of the United States Patent and Trademark Office*